(12) United States Patent
Voldman et al.

(10) Patent No.: US 6,549,061 B2
(45) Date of Patent: Apr. 15, 2003

(54) ELECTROSTATIC DISCHARGE POWER CLAMP CIRCUIT

(75) Inventors: Steven Howard Voldman, South Burlington, VT (US); Alan Bernard Botula, Essex Junction, VT (US); David TinSun Hui, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/026,308

(22) Filed: Dec. 20, 2001

(65) Prior Publication Data

US 2002/0186068 A1 Dec. 12, 2002

Related U.S. Application Data

(63) Continuation-in-part of application No. 09/681,667, filed on May 18, 2001, now Pat. No. 6,429,489.

(51) Int. Cl.[7] .............................................. H03K 17/615
(52) U.S. Cl. ..................... 327/483; 327/575; 327/324
(58) Field of Search ......................... 327/478, 482–492, 327/575, 309, 321, 324, 327, 310

(56) References Cited

U.S. PATENT DOCUMENTS

| | | | | |
|---|---|---|---|---|
| 3,535,532 A | * | 10/1970 | Merryman | 327/483 |
| 3,629,623 A | * | 12/1971 | Sakurai et al. | 327/575 |
| 3,671,833 A | * | 6/1972 | Rakes | 327/483 |
| 4,764,688 A | * | 8/1988 | Matsumura | 327/483 |
| 4,769,560 A | * | 9/1988 | Tani et al. | 327/575 |
| 5,684,427 A | * | 11/1997 | Stoddard et al. | 327/483 |

* cited by examiner

*Primary Examiner*—Toan Tran
(74) *Attorney, Agent, or Firm*—Richard A. Henkler

(57) ABSTRACT

An ESD clamping circuit arranged in a darlington configuration and constructed from SiGe or similar type material. The ESD clamping circuit includes additional level shifting circuitry in series with either the trigger or clamping device or both, thus allowing non-native voltages that exceed the BVCEO of the trigger and/or clamp devices.

9 Claims, 8 Drawing Sheets

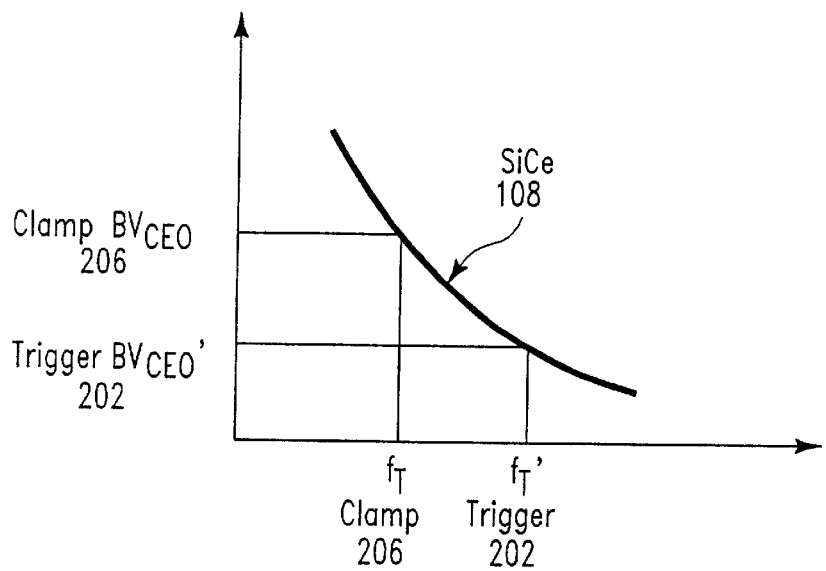
FIG. 2
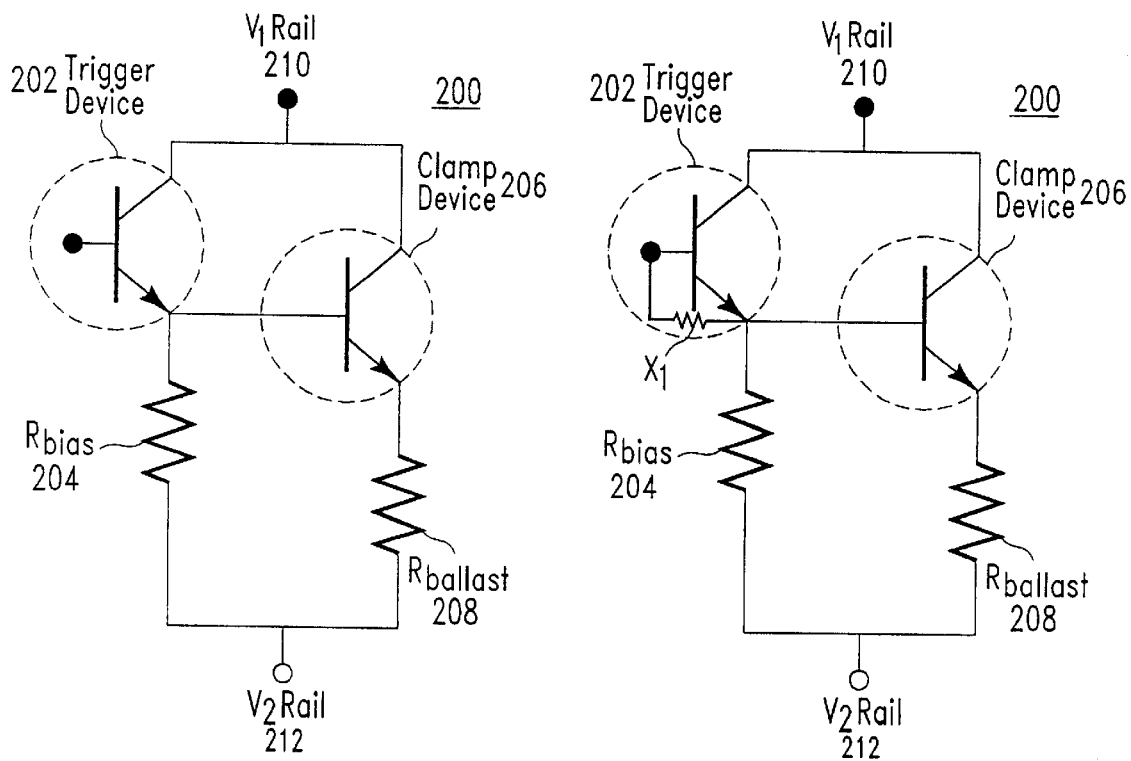
FIG. 3
FIG. 5

ELECTROSTATIC DISCHARGE POWER CLAMP CIRCUIT

This is a Continuation-in-part of application Ser. No. 09/681,667, filed May 18, 2001, now U.S. Pat. No. 6,429,489.

BACKGROUND

TECHNICAL FIELD OF THE PRESENT INVENTION

The present invention generally relates to electrostatic discharge circuits, and more specifically, to electrostatic discharge power clamp circuits.

BACKGROUND OF THE PRESENT INVENTION

Electrostatic Discharge (ESD) events, which can occur both during and after manufacturing of the Integrated Circuit (IC), can cause substantial damage to the IC. ESD events have become particularly troublesome for CMOS and BiCMOS chips because of their low power requirements and extreme sensitivity.

A significant factor contributing to the ESD sensitivity is that the transistors of the circuits are formed from small regions of N-type materials, P-type materials, and thin gate oxides. When a transistor is exposed to an ESD event, the charge applied may cause an extremely high current flow to occur within the device which can, in turn cause permanent damage to the junctions, neighboring gate oxides, interconnects and/or other physical structures.

Because of this potential damage, on chip ESD protection circuits for CMOS and BiCMOS chips are essential. In general, such protection circuits require a high failure threshold, a small layout size and a low Resistive/Capacitive (RC) delay so as to allow high speed applications.

An ESD event within an IC can be caused by a static discharge occurring at one of the power lines or rails. In an effort to guard the circuit against damage from the static discharge, circuits referred to as ESD clamps are used. An effective ESD clamp will maintain the voltage at the power line to a value which is known to be safe for the operating circuits, and not interfere with their operation under normal conditions.

An ESD clamp circuit is typically constructed between a positive power supply (e.g. VDD) and a ground plane, or a ground plane and a negative power supply (VSS). The main purpose of the ESD clamp is to reduce the impedance between the rails VDD and VSS so as to reduce the impedance between the input pad and the VSS rail (i.e. discharge of current between the input to VSS), and to protect the power rails themselves from ESD events.

The never ending demand by the consumer for increased speed in Radio Frequency (RF) devices has resulted in some unique challenges for providing ESD protection in these high speed applications. More specifically, the physical size (e.g. Breakdown voltage) and loading effects of the ESD devices must now be considered in such high speed applications (e.g. 1–200 Giga Hertz range). The capacitive loading of the ESD device itself becomes a major concern for chips running at high frequencies, since the capacitive loading has an adverse effect on performance. For example, the capacitive loading effect of a typical ESD clamp at a frequency of 1 Hz is 0.5 pF, 10 GHz–0.1 pF, and at 100 GHz–0.05pF, 200 Hz–0.01 pF).

In bipolar transistors, there is an inverse relationship between the breakdown voltage and the current gain cutoff frequency known as the Johnson Limit. In each technology generation, the cutoff frequency increases leading to lower collector to emitter breakdown voltages BVCEO. At the same time, mixed voltage applications exist where chips of non-native power supply voltages need to be applied above the BVCEO of the transistor. The term "non-native" as used herein refers to any power supply that is greater than that for which the transistor is constructed.

It would, therefore, be a distinct advantage to have an ESD clamp that could provide substantial benefits in high speed devices while limiting any performance degradation from capacitive loading. It would be further advantageous to have an ESD clamp that provides the ability to raise the clamp and/or trigger condition above the native power supply voltages. The present invention provides such an ESD clamp.

SUMMARY OF THE PRESENT INVENTION

In one aspect, the present invention is an ESD device that is useful in high speed radio frequency applications where size and loading effects are a concern. The ESD device is preferably constructed on a SiGe, SiGeC or equivalent type material that nearly approximates the Johnson Limit curve, and constructed in a Darlington type configuration. In the preferred embodiment of the present invention, the trigger device has a collector-to-emitter breakdown voltage (BVCEO) that is lower than that of the clamping device, and a frequency cutoff that is higher than that of the clamping device.

In yet another aspect, the present invention is an ESD device preferably constructed on a SiGe, SiGeC or equivalent type material that nearly approximates the Johnson Limit curve, constructed in a Darlington type configuration, and that allows a trigger condition below the BVCEO of the clamp element and above the BVCEO of the trigger element.

In yet a further aspect, the present invention is an ESD device preferably constructed on a SiGe, SiGeC, or equivalent type material that nearly approximates the Johnson Limit curve, constructed in a Darlington type configuration, and where the trigger/clamp rail is level shifted relative to the power supply rail conditions, avoiding the Johnson limit constraint on the trigger and clamp elements.

BRIEF DESCRIPTION OF THE DRAWINGS

The present invention will be better understood and its advantages will become more apparent to those skilled in the art by reference to the following drawings, in conjunction with the accompanying specification, in which:

FIG. 2 is a pictorial diagram illustrating the frequency cutoff and BVCEO characteristics of a trigger and a clamp device constructed in accordance with the teachings of the present invention;

FIG. 3 is a schematic diagram illustrating a Darlington ESD clamp constructed in accordance with the teachings of the present invention;

FIG. 5 is a circuit diagram of the Darlington ESD clamp of FIG. 3 as modified according to the teachings of the present invention;

DETAILED DESCRIPTION OF THE PREFERRED EMBODIMENT OF THE PRESENT INVENTION

In the following description, numerous specific details are set forth, however, it will be obvious to those of ordinary skill in the art that the present invention can be practiced with different details. In other instances, well-known circuits have been shown in block diagram form in order not to obscure the present invention in unnecessary detail.

The present invention capitalizes upon the recognition that the structural and physical characteristics of Silicon Germanium (SiGe) material and other equivalent materials (e.g. Silicon Germanium Carbon "SiGeC") are ideal for use in an ESD clamp for high speed applications. More specifically, the present invention recognizes that the scaling of the SiGe heterojunction bipolar transistor is driven by both structural changes and the physical limitations of the transistor itself and such recognition's can be used where size and loading effects are important.

An equation $(P_m X_c)^{1/2} f_T = E_m Vs/2\pi$ known as the Johnson Limit describes a fundamental relationship between the frequency response of the transistor and the maximum power applied across the transistor element. $P_m$ represents the maximum power, $X_c$ is represents the reactance ($X_c = 1/2\pi f_T C_{bc}$), $f_T$ represents the unity current gain cutoff frequency, $E_m$ represents the maximum electric field, and Vs represents the electron saturation velocity. The equation can be manipulated so that is it is expressed in terms of maximum voltage $V_m f_T = E_m Vs/2\pi$ to illustrate the inverse relationship between the transistor speed and the allowed breakdown voltage.

Figure 1:
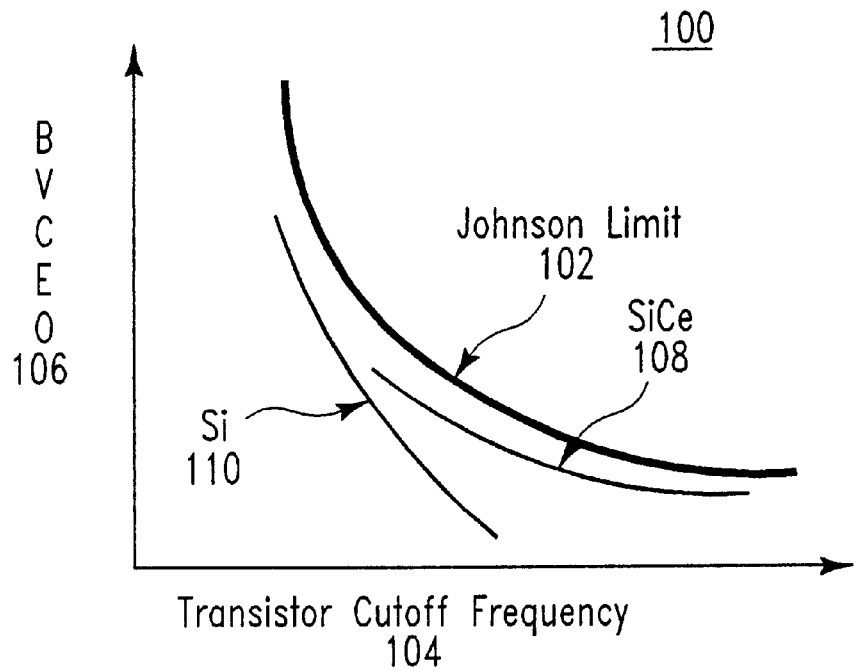
FIG. 1 is a pictorial diagram illustrating in greater detail the Johnson Limit curve.

FIG. 1 is a pictorial diagram 100 illustrating in greater detail the Johnson Limit curve 102 and approximations of how transistors constructed of Silicon and SiGe would compare. In this diagram 100, the x-axis represents $f_T$, and the y-axis represents the Breakdown Voltage of the transistor from the collector-to-emitter (BVCEO). The curve 102 demonstrates that the BVCEO of the transistor decreases with the increase in the unity current gain cutoff frequency ($f_T$). Approximations of how a transistor constructed of Si (Silicon) 110 and SiGe 108 have been transposed on the diagram 100.

FIG. 2 is a pictorial diagram illustrating the frequency cutoff and BVCEO characteristics of a trigger and a clamp device constructed in accordance with the teachings of the present invention. As previously discussed and illustrated in FIG. 1, a transistor constructed from SiGe material closely approximates the Johnson Limit curve. The present invention recognizes and capitalizes upon this recognition. More specifically, the present invention uses a first ESD device having a low BVCEO and a high $f_T$ to trigger (Trigger 202) a second ESD device having a $f_T$, that is lower than that of the first ESD device, and a BVCEO that is higher than that of the first ESD device (Clamp 206).

Because of the Johnson Limit relationship, the frequency response of the "trigger" transistor 202 is at a higher frequency for a device with a lower breakdown voltage.

In the preferred embodiment, the first and second devices are arranged in a common-collector configuration as explained in greater detail in connection with FIG. 3.

FIG. 3 is a schematic diagram illustrating a Darlington ESD clamp 200 constructed in accordance with the teachings of the present invention. Specifically, the Darlington ESD clamp 200 is constructed between two power rails V1 210 and V2 212. Power rails V1 and V2 can be, for example, Power and Ground or Ground and negative Power, respectively. The Darlington ESD clamp 200 includes a trigger device (npn SiGe transistor) 202, a clamp device (npn SiGe transistor) 206, bias resistor 204, and ballast resistor 208.

It should be noted that although a single stage Darlington ESD clamp 200 has been illustrated for ease of explanation purposes, the present invention is equally applicable to multiple staged Darlington pairs/stages as well (e.g. A plurality of trigger and/or clamp elements).

Trigger device 202 has a BVCEO that is lower than that of the clamp device 206 and a cutoff frequency that is higher than that of the clamp device 206. During an ESD event, the trigger device 202, upon reaching its BVCEO, will provide base current into the clamp device 206.

Conversely, clamp device 206 has a BVCEO that is higher than that of the trigger device 202, a cutoff frequency that is lower than that of the trigger device 202, and discharges the current from the ESD event from Power rail V1 to V2.

In series with the clamp device 206 is ballast resistor 208. Ballast resistor 208 is used in a conventional fashion for providing emitter stability, voltage limitations, thermal stability, and ESD stability.

In series with trigger device 202 is bias resistor 204. Bias resistor 204 is used for keeping the base of the clamp device 206 to a low potential in order to limit the amount of current that flows through the trigger device 202 during an ESD event.

In the preferred embodiment of the present invention, the trigger device 202 is a SiGe heterojunction bipolar transistor (HBT) formed in the configuration explained in connection with FIG. 4 below.

Figure 4:
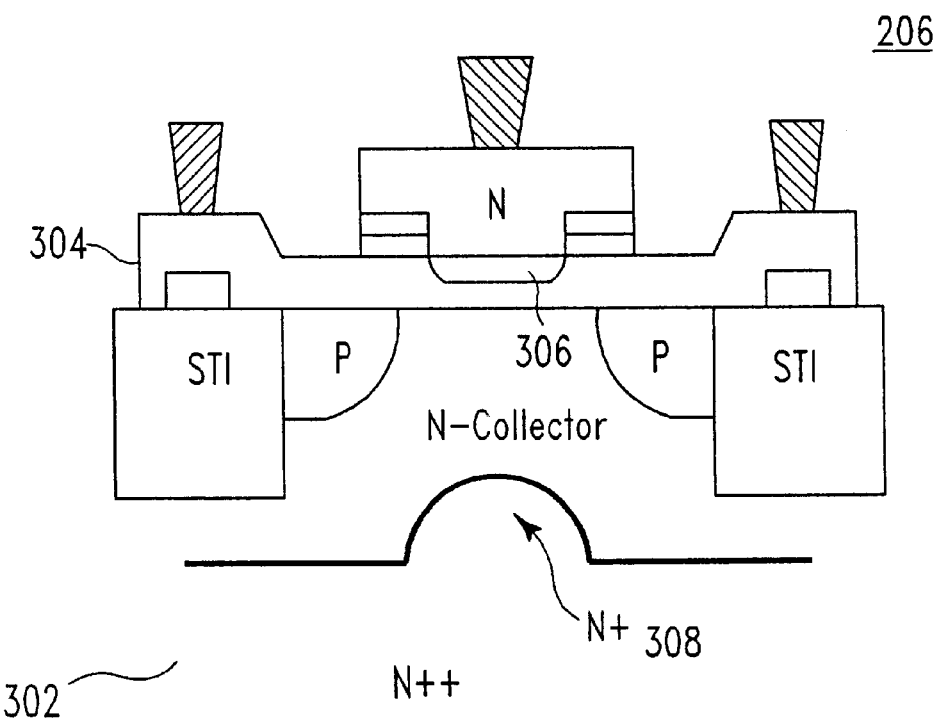
FIG. 4 is a cross sectional view diagram of an implementation of the trigger device of the clamp of FIG. 3 as a SiGe Heterojunction Bipolar Transistor (HBT) according to the teachings of the present invention.

FIG. 4 is a cross sectional view diagram of an implementation of the trigger device 202 of FIG. 3 as a SiGe HBT according to the teachings of the present invention. The SiGe HBT 202 is formed on a n++ subcollector 302. The SiGe epitaxial film is placed on the silicon surface forming the extrinsic base 304 over the STI isolation and the intrinsic base region 306 over the single crystal silicon region. An n+ pedestal implant 308 is formed through the emitter window.

The pedestal implant 308 is typically formed to reduce the Kirk effect. The Kirk effect is due to the high current density which forces the space charge region of the base-collector junction to get pushed into the collector region reducing the frequency response of the transistor. To prevent this, an extra "pedestal implant" is placed so as to maintain a high $f_T$ device, which in turn causes a low BVCEO breakdown voltage. Obviously, more pedestal implants can be added to lower the BVCEO until a desired level is obtained.

In the preferred embodiment of the present invention, a first pedestal implant is placed in both the clamp 206 and trigger 202 devices. A second pedestal implant is used through the emitter window to form the high frequency trigger device 202.

Alternative embodiments of both the clamp 206 and trigger 202 devices can be created by adding additional pedestal and/or CMOS N-well implants. For example, table below illustrates how such implants could be used to create three distinct transistors each of which have a differing $f_T$.

| Device $f_T$ | Implants |
| --- | --- |
| Low | First pedestal only |
| Medium | First pedestal and N-Well |
| High | First and second pedestals |

From the above table it can be seen that a low $f_T$ device is created by implanting a single pedestal, a medium (with respect to the low and high devices) $f_T$ device by implanting a single pedestal and a N-Well implant from CMOS technology into the collector region, and a high $f_T$ device by implanting two pedestals.

Figure 6:
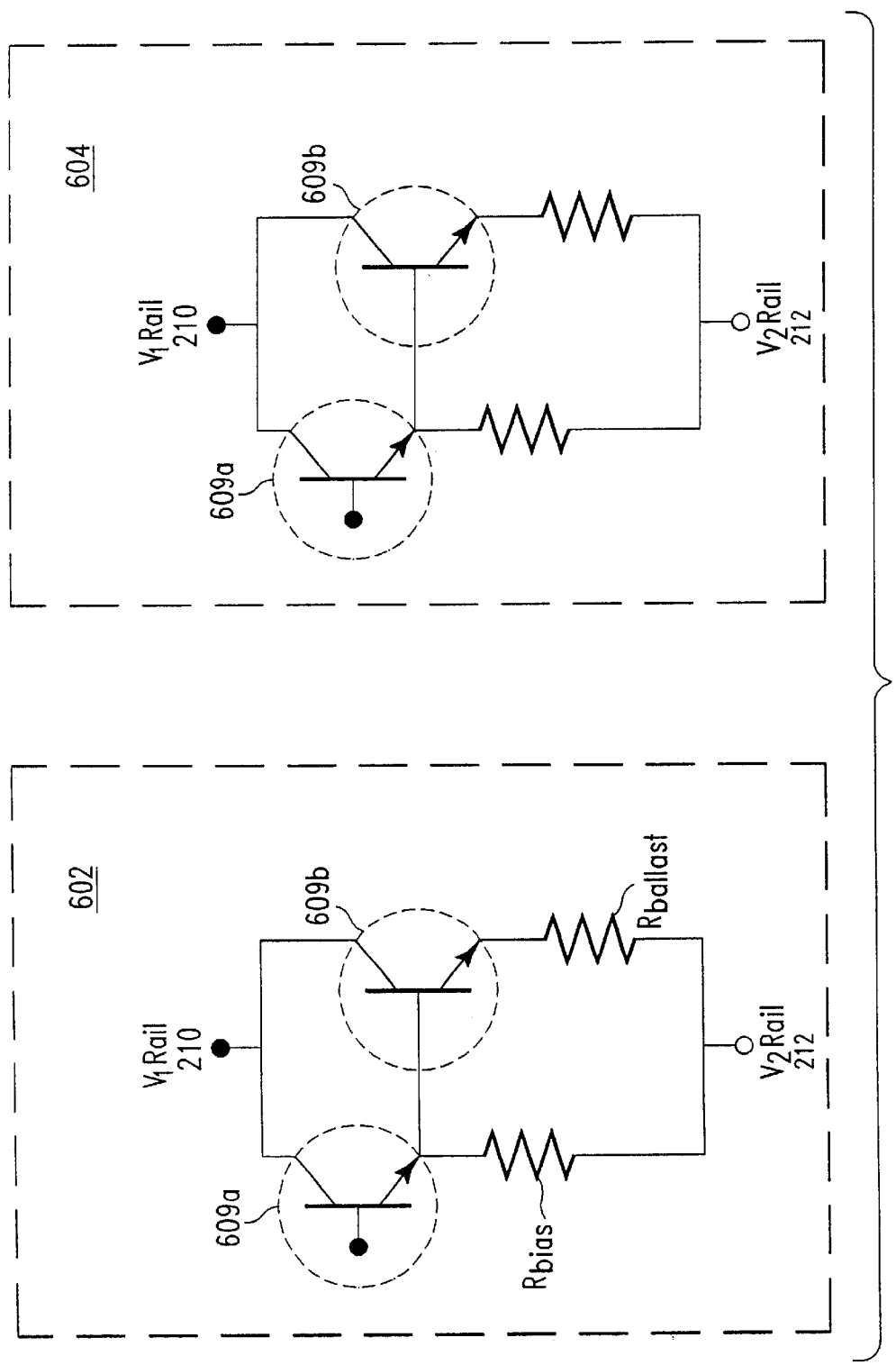
FIG. 6 is a schematic diagram of a dual stage darlington ESD clamp according to the teachings of the present invention.

As previously stated, the present invention is equally applicable to multi-staged Darlington ESD clamps. FIG. 6 and its accompanying description further illustrate such applicability.

FIG. 6 is a schematic diagram of a dual stage darlington ESD clamp according to the teachings of the present invention. First ESD clamp 602 is constructed from a high $f_T$ trigger device 602a coupled to a medium $f_T$ clamp device 602b. The second ESD clamp 604 is constructed from a medium $f_T$ trigger device 604a, having its base coupled to the emitter of the clamp device 602b, and its emitter coupled to the base of a low $f_T$ clamp device 604b.

FIG. 5 is a circuit diagram of the Darlington ESD clamp 200 of FIG. 3 as modified according to the teachings of the present invention. The Darlington ESD Clamp 200 of FIG. 3 has been modified to include a resistor R1 coupled between the base and emitter of the trigger device 202. Resistor R1 provides changes the turn on characteristics of the trigger device 202 so that during Direct Current (DC) operation it is not activated by spurious signals.

From the above description it should be apparent to one skilled in the art that the present invention is applicable to high frequency devices where a trigger device triggers an ESD clamp, regardless of the particular configuration. The construction of the trigger and clamp devices can vary depending on the particular application, provided the trigger device has a BVCEO that is lower than the BVCEO of the clamping device, and a frequency cutoff that is higher than that of the clamping device. For example, if a high BVCEO is desired then this can be accomplished by having no pedestal or CMOS N-well structures in the transistor. If a medium BVCEO is desired then this can be accomplished by creating pedestal and/or CMOS N-well structures in the transistor. If a low BVCEO is desired, then this can be accomplished by implanting one or more pedestals and/or multiple CMOS N-well structures into the transistor.

Alternative Embodiments

In another embodiment, the trigger device 202 of either FIGS. 3 or 5 can be constructed with Silicon Germanium in the base region forming a SiGe heterojunction bipolar transistor (HBT). The clamp device 206 can be a silicon bipolar junction transistor (BJT). In this embodiment, the trigger device 202 will have a lower breakdown voltage and higher frequency threshold than the clamp device 206.

In yet another embodiment, both the trigger 202 and clamp 206 devices are SiGe HBT devices. The trigger device 202 has been constructed with the pedestal implant as discussed in connection with FIG. 4.

In a further embodiment, both the trigger 202 and clamp 206 devices are SiGe HBT devices. The trigger device 202 has been constructed with a plurality of pedestal implants as discussed in connection with FIG. 4, or alternatively a plurality of CMOS n-well implants could be added to the collector region to provide a high frequency threshold device.

In yet another embodiment, the trigger device 202 can be a SiGeC HBT where the base region contains both Germanium and Carbon to provide a high frequency threshold and a low BVCEO. The clamp device 206 is a SiGe HBT.

Mixed Voltage Applications

In yet another embodiment, the present invention has the ability to address mixed voltage applications where the power supply conditions exceed the native breakdown voltages of the transistors. More specifically, the present invention is preferably applicable to ESD power clamps for BiCMOS applications and Bipolar applications that have voltage differentials between the power rails which are larger than the native power voltage conditions of the transistors themselves.

In these type of designs, the trigger condition for the trigger and clamp voltages needs to be modified to address these higher voltage conditions.

The present invention introduces a new relationship between the trigger voltage and the clamp voltage by placing level shifting elements between the collectors of the trigger and clamp devices and the power supply. The use of these level shifting elements creates a new condition for the trigger device 202.

Figures 7, 9:
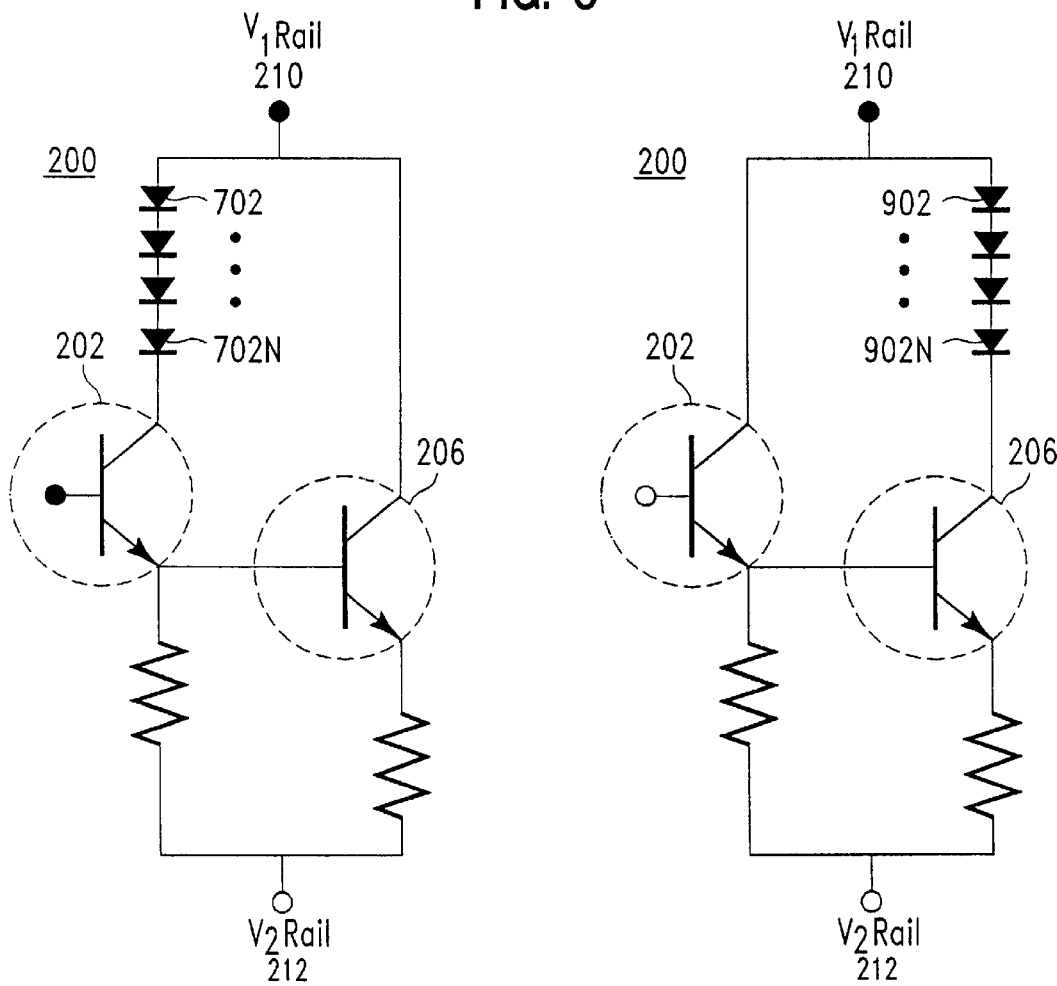
FIG. 7 is a schematic diagram of the darlington ESD clamp of FIG. 3 modified according to the teachings of an alternative embodiment of the present invention.
FIG. 9 is a schematic diagram of the darlington ESD clamp of FIG. 3 modified according to the teachings of an alternative embodiment of the present invention.

FIG. 7 is a schematic diagram of the ESD clamp 200 of FIG. 3 modified according to the teachings of an alternative embodiment of the present invention. The ESD clamp 200 of FIG. 3 has been modified by introducing a plurality of level shifting elements 702-N in series with the collector of the Trigger device 202 and v1 rail 210. The term level shifting elements as used herein refers to diodes, varactors, pin diode elements, Schottky diodes, pnp elements in a common collector configuration or MOSFETs. These level shifting elements can be pnp transistor elements or diode type elements, and can be constructed from SiGe, SiGeC, or CMOS devices.

The addition of the level shifting elements in series with the trigger device 202 establishes a new trigger condition. More specifically, the addition of the level shifting elements 702-N elevates (shifts) the BVCEO vs. $f_T$ curve, forming a new "trigger condition" relationship as explained in greater detail in connection with FIG. 8.

Figure 8:
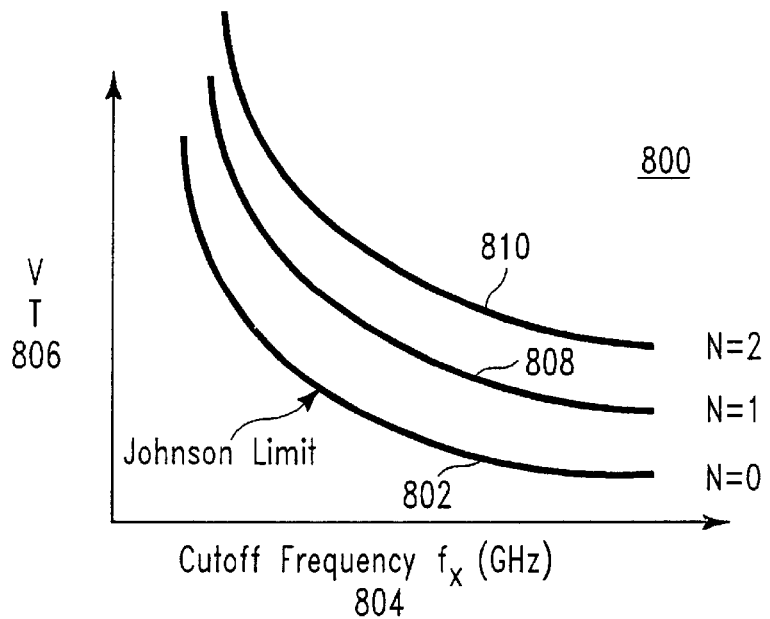
FIG. 8 is a pictorial diagram illustrating the initial Johnson limit curve in relation to the trigger and clamp devices of FIG. 3 as modified to include new pnp elements according to the teachings of the present invention.

FIG. 8 is a pictorial diagram 800 illustrating the trigger condition of an ESD device constructed in accordance with the teachings of the present invention. In this diagram 800, the x-axis represents the unity current cutoff frequency $f_T$, and the y-axis represents the "trigger condition". The addition of the level shifting elements 702-N in series with the trigger device 202 develops a new variable trigger implementation.

In the case where pnp elements are placed in series with the trigger device 202, the trigger condition is level shifted to a higher breakdown condition. Adding a string of pnp elements creates a new trigger condition defined as $V_T = E_m v_s/2\Pi f_T + NV_f - (kT/q)(N-1)N/2 \ln(\beta+1)$ where N is the number of pnp elements, $V_f$ is the forward diode voltage, and $\beta$ is the pnp current gain and $f_T$ is the unity current gain cutoff frequency of the trigger device. This trigger condition provides a set of design contours of trigger values where the number of level shifting elements and the cutoff frequency are the trigger parameters.

In the case where non-pnp elements are placed in series with the trigger device 202, the above noted equation changes to $V_T = E_m v_s/2\Pi f_T + NV_f$.

Curve 802 represents the situation where no level shifting elements are in series with the trigger device 202. In this situation, the trigger condition equals the breakdown voltage, and the trigger condition is substantially equal to the Johnson limit curve. Curves 808, and 810 illustrate the affects of adding one or more respectively pnp level shifting elements in series with the trigger device 202.

As can be seen, the additional pnp level shifting elements (N=1,2) shift the curve in an upward direction on the diagram 800. This allows the trigger device 202 to accommodate power supply voltages that previously exceeded its BVCEO. In this manner, the triggering of the circuit 200 allows for decoupling of the frequency response of the device (202) from the trigger condition of the circuit embodiment 200.

FIG. 9 is a schematic diagram of the ESD clamp 200 of FIG. 3 modified according to the teachings of an alternative embodiment of the present invention. The ESD clamp 200 of FIG. 3 has been modified to include a plurality of pnp elements 902-N in series with the collector of the clamp device 206. In this configuration, a new breakdown voltage is established for the clamp device 206 that avoids over voltage when placed between power supplies for mixed voltage applications, or power supply differential voltages that exceed the breakdown voltage of the clamp device 206, or voltages above the native power supply voltage of the semiconductor chip.

In the case where pnp elements are placed in series with the clamp device 206, the clamp breakdown condition is shifted to a higher breakdown condition. Adding a string of pnp elements creates a new trigger condition as defined by the equation $V_C = E_m v_s/2\Pi f_T + MV_f - (kT/q)(M-1)M/2 \ln(\beta+1)$ where M is the number of pnp elements, $V_f$ is the forward diode voltage, and $\beta$ is the pnp current gain and $f_T$ is the unity current gain cutoff frequency of the clamp device. This breakdown condition provides a set of design contours of breakdown values where the number of elements and the cutoff frequency are the clamp element breakdown parameters.

In the case where non-pnp elements are placed in series with the clamp device 206, the above noted equation changes to $V_C = E_m v_s/2\Pi f_T + MV_f$.

Figure 10:
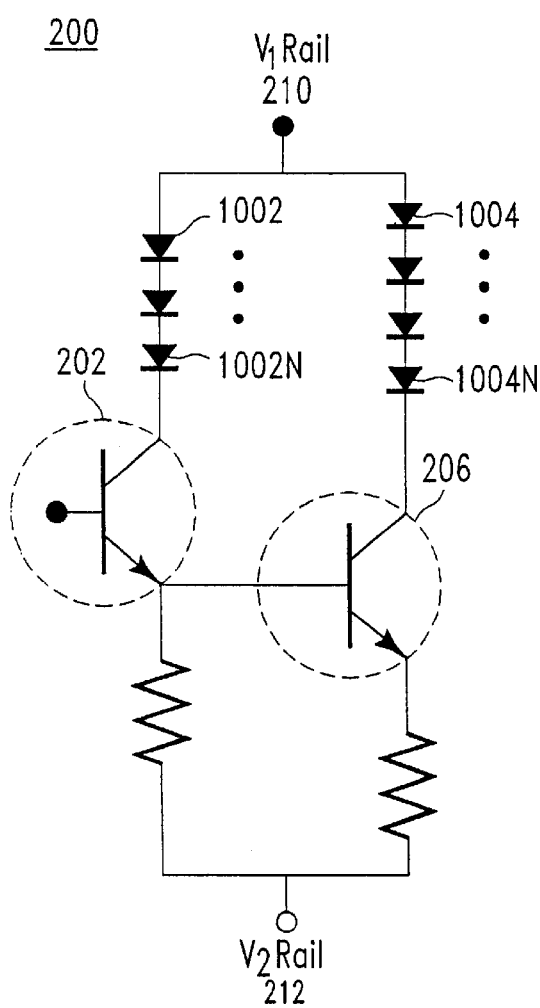
FIG. 10 is a schematic diagram of the darlington ESD clamp of FIG. 3 modified according to the teachings of an alternative embodiment of the present invention.

FIG. 10 is a schematic of the ESD clamp 200 of FIG. 3 modified according to the teachings of an alternative embodiment of the present invention. The ESD clamp 200 of FIG. 3 has been modified to include a plurality of pnp elements 1002-N and 1004-M in series with both the trigger 202 and clamp 204 devices, respectively. In this configuration, both the trigger and clamp breakdown conditions allow for elevation of the differential voltage placed across the trigger device 202 and the clamp device 204.

In the case where pnp elements are placed in series with the trigger device 202, the trigger condition is shifted to a higher breakdown condition. Adding a string of pnp elements creates a new trigger condition as defined by the following equation $V_T = E_m v_s/2\Pi f_T + NV_f - (kT/q)(M-1)M/2 \ln(\beta+1)$ where N is the number of pnp elements, $V_f$ is the forward diode voltage, and $\beta$ is the pnp current gain and $f_T$ is the unity current gain cutoff frequency of the trigger device. This trigger condition provides a set of design contours of trigger values where the number of elements and the cutoff frequency are the trigger parameters.

In the case where non-pnp elements are placed in series with the trigger device 202, the above equation changes to $V_T = E_m v_s/2\Pi f_T + NV_f$.

In the case where pnp elements are placed in series with the clamp device 204, the clamp breakdown condition is shifted to a higher breakdown condition. Adding a string of pnp elements creates a new trigger condition as defined by the following equation $V_C = E_m v_s/2\Pi f_T + MV_f - (kT/q)(M-1)M/2 \ln(\beta+1)$ where M is the number of pnp elements, $V_f$ is the forward diode voltage, and $\beta$ is the pnp current gain, and $f_T$ is the unity current gain cutoff frequency of the clamp device. This breakdown condition provides a set of design contours of breakdown values where the number of elements and the cutoff frequency are the clamp element breakdown parameters.

In the case where non-pnp elements are placed in series with the clamp device 204, the above noted equation changes to $V_c = E_m v_s/2\Pi f_T + MV_f$.

Figure 11:
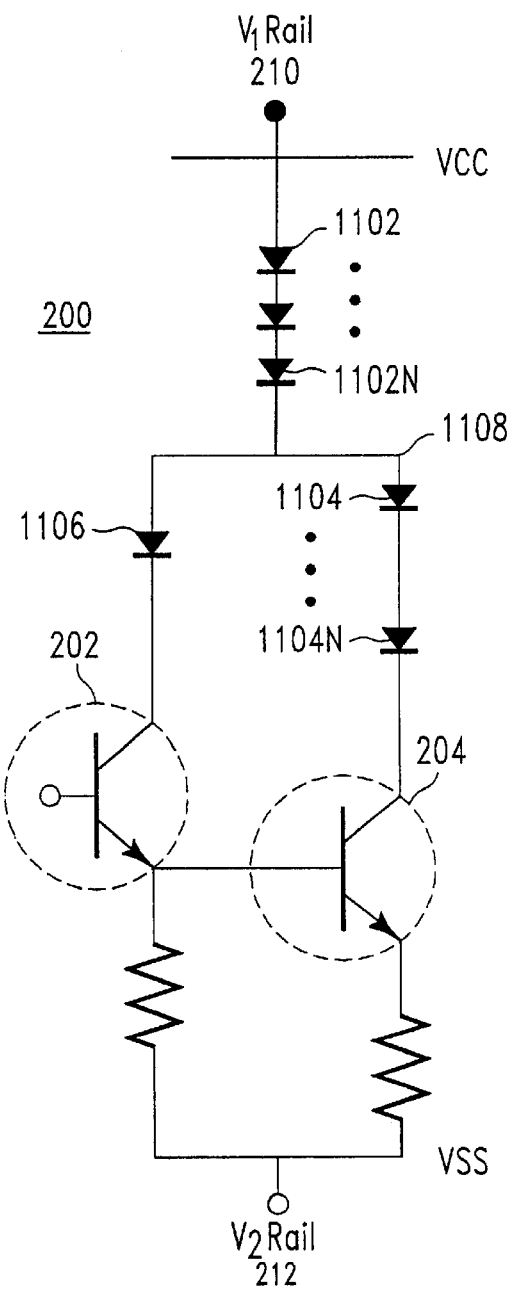
FIG. 11 is a schematic diagram of the darlington ESD clamp 200 of FIG. 3 modified according to the teachings of an alternative embodiment of the present invention.

FIG. 11 is a schematic diagram of the ESD clamp 200 of FIG. 3 modified according to the teachings of an alternative embodiment of the present invention. The ESD clamp 200 of FIG. 3 has been modified to include a plurality of pnp elements 1102-P placed in series between the v1 rail 210 (e.g. power supply) and the trigger/clamp rail 1108. The addition of pnp elements 1102-P avoids the Johnson limit condition for both the trigger 202 and the clamp 204 devices. Specifically, the pnp elements delay the turning on of the ESD clamp 200, thus allowing a non-native power supply condition to be placed on the power rail VCC without the initiation of the ESD clamp 200.

In this case, the trigger condition is defined by the following equation $V_T = E_m v_s/2\Pi f_T + NV_f - (kT/q)(N-1)N/2 \ln(\beta+1) + PV_f - (kT/q)(M1)P/2 \ln(\beta+1)$ where N is the number of pnp elements, $V_f$ is the forward diode voltage, and $\beta$ is the pnp current gain and $f_T$ is the unity current gain cutoff frequency of the trigger device, and P is the number of pnp elements of the string between rail 210 and rail 1108 whose $V_f$ is the forward diode voltage, and $\beta$ is the pnp current gain.

In this case, the clamp condition is defined by the following equation $V_c = E_m v_s/2\Pi f_T + MV_f - (kT/q)(M-1)M/2 \ln(\beta+1) + PV_f - (kT/q)(P-1)P/2 \ln(\beta+1)$ where M is the number of pnp elements, $V_f$ is the forward diode voltage, and $\beta$ is the pnp current gain and $f_T$ is the unity current gain cutoff frequency of the clamp device, and P is the number of pnp elements of the string between rail 210 and rail 1108 whose $V_f$ is the forward diode voltage, and $\beta$ is the pnp current gain.

Figure 12:
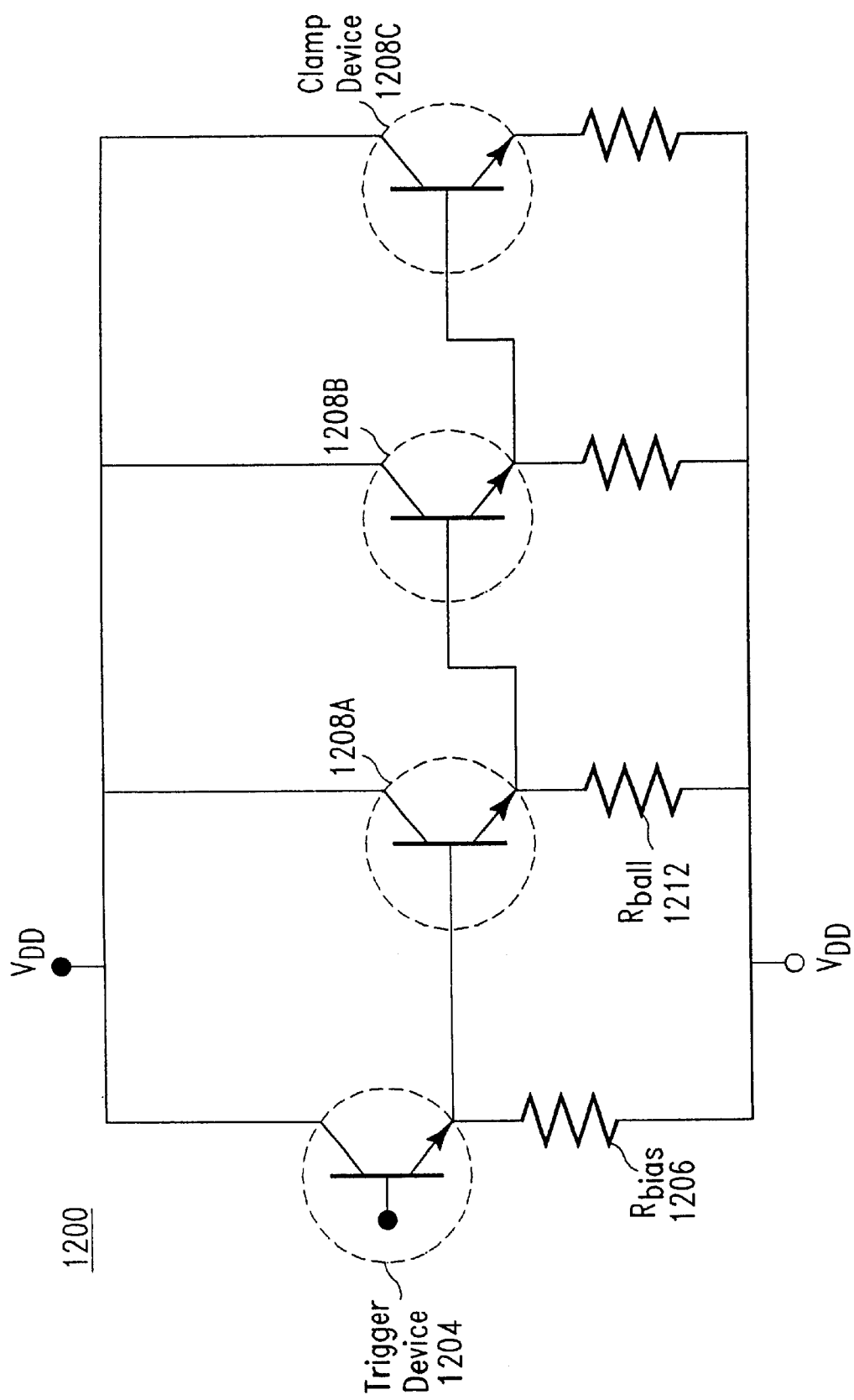
FIG. 12 is a schematic diagram illustrating an alternative embodiment of an ESD clamp structure where the clamp network size is increased according to the teachings of the present invention.

FIG. 12 is a schematic diagram illustrating an alternative embodiment of an ESD clamp structure 1200 where the clamp network size is increased according to the teachings of the present invention. As the clamp device size increases, the trigger device 1204 cannot supply the current to all base devices equally. The clamp device 1208 can be designed so as to have multiple clamp devices 1208A–B as illustrated in FIG. 12. More specifically, the emitter of clamp device 1208A is connected to the base of the second clamp device 1208B, and the emitter of the second clamp device 1208B is connected to the base of the third clamp device 1208C.

In this fashion, as the trigger device 1204 supplies current to the base of the first clamp device 1208A, current flows from the emitter through the ballast resistor 1212. As the current flows through the ballast resistor 1212, the base 1208A rises leading to a $V_{be}$ to be established in the second clamp device 1208B. This leads to the turn-on of the second clamp device 1208B, and allowing the ESD current to flow through the second clamp element 1208B. This process continues with third clamp device 1208C.

Figure 13:
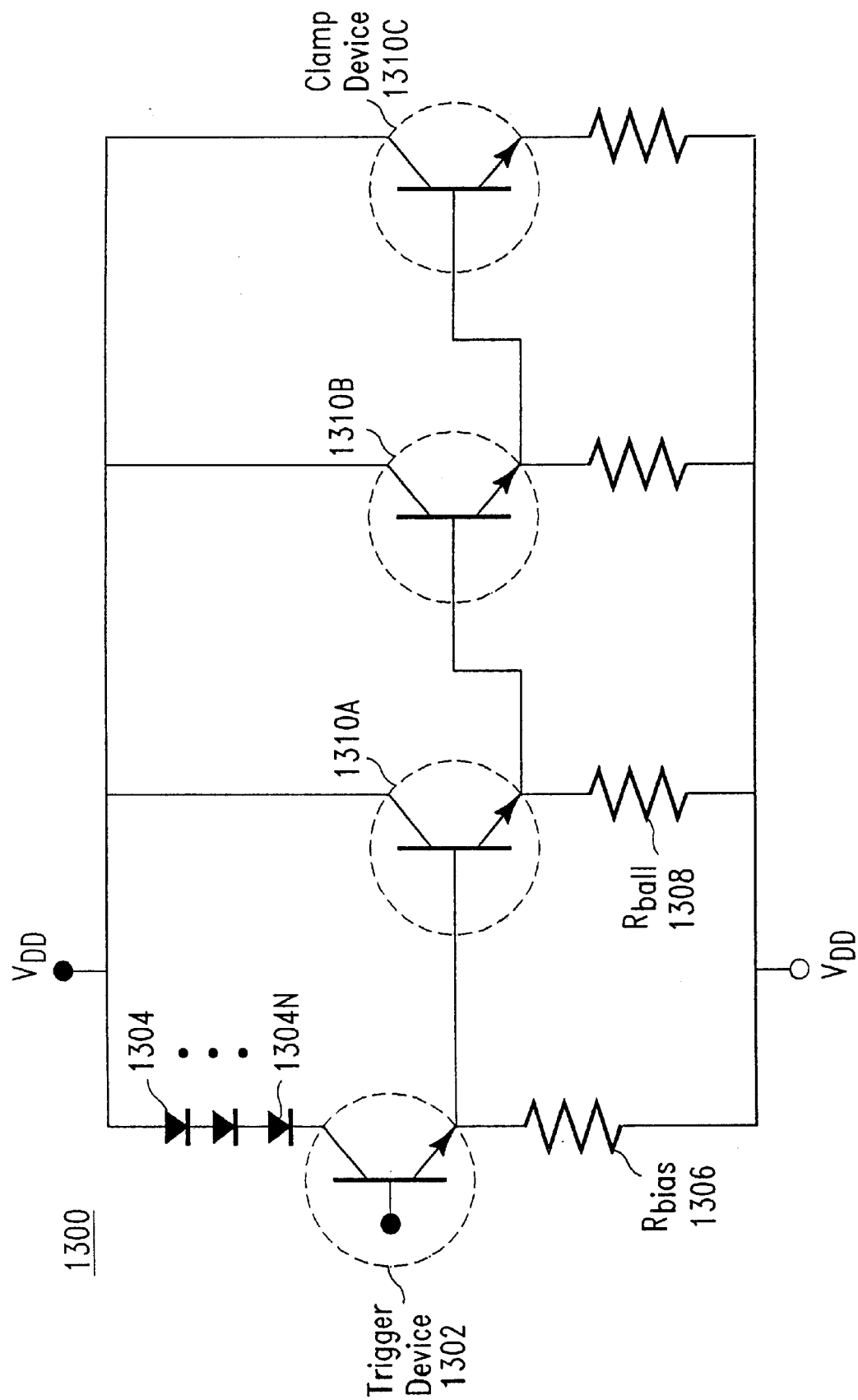
FIG. 13 is a schematic diagram illustrating an alternative embodiment of an ESD clamp structure where the clamp network size is increased according to the teachings of the present invention.

FIG. 13 is a schematic diagram illustrating an alternative embodiment of an ESD clamp structure 1300 where the clamp network size is increased according to the teachings of the present invention. In this embodiment, a series of pnp elements 1304-N are placed in series with the trigger device 1302 in order to delay the turn-on of the ESD clamp circuit 1300.

Figure 14:
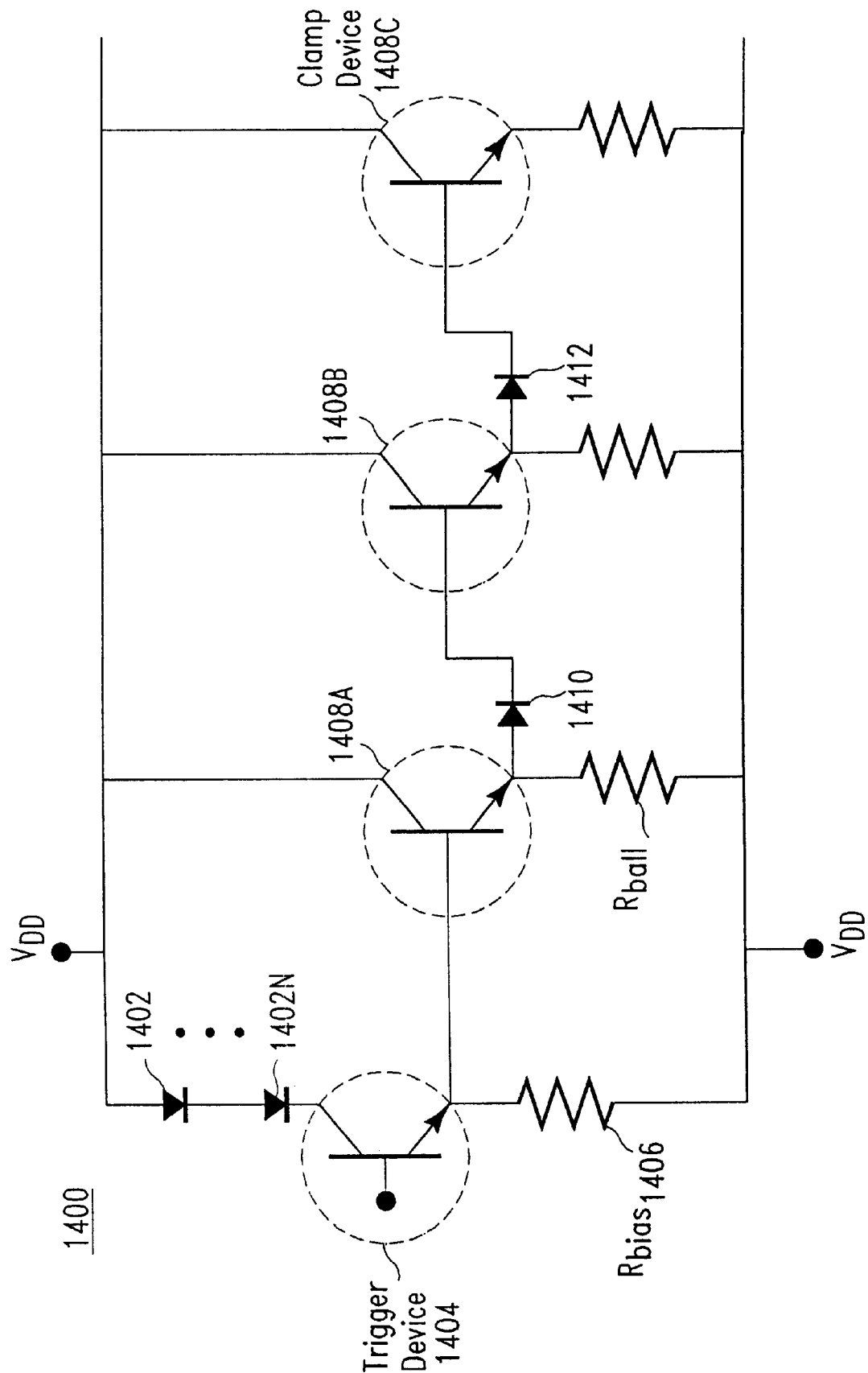
FIG. 14 is a schematic diagram illustrating an alternative embodiment of an ESD clamp structure where the clamp network size is increased according to the teachings of the present invention.

FIG. 14 is a schematic diagram illustrating an alternative embodiment of an ESD clamp structure 1400 where the clamp network size is increased according to the teachings of the present invention. In this embodiment, a series of pnp elements are placed in series with the trigger device 1302 in order to delay the turn-on of the ESD clamp circuit 1400. An additional pnp element 1410 and 1412 is placed between each successive stage of the clamp circuit 1400. As the BVCEO is reached in the device, current will flow through the device into the base of the first clamp element. The addition of rectifying elements in series with the base of the successive clamp devices 1408A–B will prevent current flowing between successive stages of the clamp network.

It is thus believed that the operation and construction of the present invention will be apparent from the foregoing description. While the method and system shown and described has been characterized as being preferred, it will be readily apparent that various changes and/or modifications could be made wherein without departing from the spirit and scope of the present invention as defined in the following claims.

What is claimed is:

1. An electrostatic discharge device comprising:
   a trigger transistor;
   a plurality of first level shifting elements coupled in series with the collector of the trigger transistor;
   a first power rail coupled to one of the level shifting elements;
   a clamp transistor having its base coupled to the emitter of the trigger transistor and its collector coupled to the first power rail, the clamp transistor having a frequency cutoff and a breakdown voltage that are both larger than that of the trigger transistor; and
   a second power rail coupled to the emitters of both the trigger and clamp transistors.

2. The electrostatic discharge device of claim 1 wherein the trigger and clamp transistors are constructed from silicon germanium material.

3. The electrostatic discharge device of claim 1 further comprising:
   a plurality of second level shifting elements coupled in series between the collector the clamp transistor and the first power rail.

4. The electrostatic discharge device of claim 3 wherein the trigger and clamp transistors are constructed from silicon germanium material.

5. An electrostatic discharge device comprising:
   a trigger transistor;
   a first power rail coupled to the collector of the trigger transistor;
   a plurality of first level shifting elements coupled in series with one another and the first power rail;
   a clamp transistor having its base coupled to the emitter of the trigger transistor and its collector coupled to one of the first level shifting elements, the clamp transistor having a frequency cutoff and a breakdown voltage that are both larger than that of the trigger transistor; and
   a second power rail coupled to the emitters of both the trigger and clamp transistors.

6. The electrostatic discharge device of claim 5 wherein the trigger and clamp transistors are constructed from silicon germanium material.

7. The electrostatic discharge device of claim 5 further comprising:
   a plurality of second level shifting elements coupled in series between the collector the trigger transistor and the first power rail.

8. The electrostatic discharge device of claim 7 wherein the trigger and clamp transistors are constructed from silicon germanium material.

9. An electrostatic discharge device comprising:
   a trigger transistor;
   a first power rail coupled to the collector of the trigger transistor;
   a first clamp transistor having a frequency cutt off and breakdown voltage that are both larger than that of the trigger transistor, the collector being coupled to the first power rail and the base being coupled to the emitter of the trigger transistor;
   a second clamp transistor having a frequency cutoff and a breakdown voltage that are both larger than that of the trigger transistor, the collector coupled to the first power rail and the base being coupled to the emitter of the first clamp transistor;
   a second power rail coupled to the emitters of the trigger, first and second clamp transistors.

* * * * *